(12) United States Patent  (10) Patent No.: US 8,094,980 B2
Diamond et al.  (45) Date of Patent: Jan. 10, 2012

(54) PROOF-MASS WITH SUPPORTING STRUCTURE ON INTEGRATED CIRCUIT-MEMS PLATFORM AND METHOD OF FABRICATING THE SAME

(75) Inventors: Brett M. Diamond, Monroeville, PA (US); Matthew A. Zeleznik, Pittsburgh, PA (US); Jan E. Vandemeer, Bethel Park, PA (US); Kaigham J. Gabriel, Pittsburgh, PA (US)

(73) Assignee: Akustica, Inc., Pittsburgh, PA (US)

( * ) Notice: Subject to any disclaimer, the term of this patent is extended or adjusted under 35 U.S.C. 154(b) by 17 days.

(21) Appl. No.: 12/651,551

(22) Filed: Jan. 4, 2010

(65) Prior Publication Data

US 2010/0147076 A1  Jun. 17, 2010

Related U.S. Application Data

(62) Division of application No. 11/640,345, filed on Dec. 18, 2006, now Pat. No. 7,640,805.

(51) Int. Cl.
G02B 6/42 (2006.01)
G02B 26/08 (2006.01)
(52) U.S. Cl. .................. 385/18; 359/223.1; 310/309
(58) Field of Classification Search .............. 73/514.18, 73/514.32; 310/309; 359/223.1; 385/18
See application file for complete search history.

(56) References Cited

U.S. PATENT DOCUMENTS

| | | |
|---|---|---|
| 4,851,080 A | 7/1989 | Howe et al. |
| 5,008,774 A | 4/1991 | Bullis et al. |
| 5,343,064 A | 8/1994 | Spangler et al. |
| 5,383,364 A | 1/1995 | Takahashi et al. |
| 5,388,460 A | 2/1995 | Sakurai et al. |
| 5,717,631 A | 2/1998 | Carley et al. |

(Continued)

FOREIGN PATENT DOCUMENTS

EP 1635180 3/2006

(Continued)

OTHER PUBLICATIONS

Andrew A. Berlin & Kaigham J. Gabriel, Distributed MEMS: New Challenges fro Computation, 4 IEEE Computational Science & Engineering 12-16 (1997).

(Continued)

Primary Examiner — John Chapman, Jr.
(74) Attorney, Agent, or Firm — Kenyon & Kenyon LLP

(57) ABSTRACT

Provided is a micro-electromechanical-system (MEMS) device including a substrate; at least one semiconductor layer provided on the substrate; a circuit region including at least one chip containing drive/sense circuitry, the circuit region provided on the at least one semiconductor layer; a support structure attached to the substrate; at least one elastic device attached to the support structure; a proof-mass suspended by the at least one elastic device and free to move in at least one of the x-, y-, and z-directions; at least one top electrode provided on the at least one elastic device; and at least one bottom electrode located beneath the at least one elastic device such that an initial capacitance is generated between the at least one top and bottom electrodes, wherein the drive/sense circuitry, proof-mass, supporting structure, and the at least one top and bottom electrodes are fabricated on the at least one semiconductor layer.

21 Claims, 13 Drawing Sheets

U.S. PATENT DOCUMENTS

| | | | |
|---|---|---|---|
| 5,948,981 | A | 9/1999 | Woodruff |
| 5,970,315 | A | 10/1999 | Carley et al. |
| 6,067,858 | A | 5/2000 | Clark et al. |
| 6,201,629 | B1 * | 3/2001 | McClelland et al. ...... 359/223.1 |
| 6,378,381 | B1 | 4/2002 | Okada et al. |
| 6,458,615 | B1 | 10/2002 | Fedder et al. |
| 6,504,385 | B2 | 1/2003 | Hartwell et al. |
| 6,716,253 | B2 * | 4/2004 | Okada .................. 73/862.43 |
| 6,845,670 | B1 | 1/2005 | McNeil et al. |
| 6,936,492 | B2 | 8/2005 | McNeil et al. |
| 7,258,011 | B2 | 8/2007 | Nasiri et al. |
| 2004/0250625 | A1 | 12/2004 | Kogan et al. |
| 2005/0146241 | A1 * | 7/2005 | Wan ........................ 310/309 |
| 2005/0231805 | A1 | 10/2005 | Shiozaki et al. |
| 2006/0115920 | A1 | 6/2006 | Urano et al. |
| 2006/0169043 | A1 | 8/2006 | McNeil |

FOREIGN PATENT DOCUMENTS

| | | |
|---|---|---|
| WO | WO 01/75455 | 10/2001 |

OTHER PUBLICATIONS

Huikai Xie, et al., Post-CMOS Processing for High-Aspect-Ratio Integrated Silicon Microstructures, 11 Journal of Microelectromechanical Systems 93-101 (2002).

John J. Neumann, Jr. & Kaigham J. Gabriel, CMOS-MEMS Membrane for Audio-Frequency Acoustic Actuation, 95 Sensors & Actuators A 175-82 (2002).

Jose A Plaza, et al., Piezoresistive Accelerometers for MCM Package, Journal of Microelectromechanical Systems, IEE Service Center, Piscataway, NJ, US, vol. 11, No. 6, Dec. 1, 2002.

Kaigham J. Gabriel, Engineering Microscope Machines, 273 Scientific American 118-21 (1995).

Mehran Mehregany, et al., Integrated Fabrication of Polysilicon Mechanisms, 35 IEEE Transactions on Electron Devices 719-23 (1988).

* cited by examiner

PROOF-MASS WITH SUPPORTING STRUCTURE ON INTEGRATED CIRCUIT-MEMS PLATFORM AND METHOD OF FABRICATING THE SAME

CROSS-REFERENCE TO RELATED APPLICATION

This application is a divisional of, and incorporates herein by reference in their entirety the contents of, U.S. patent application Ser. No. 11/640,345, which was filed on Dec. 18, 2006 now U.S. Pat. No. 7,640,805.

BACKGROUND

1. Field of the Invention

The present invention relates to a micro-electro-mechanical system (MEMS) device and a method of fabricating the same.

2. Discussion of the Related Art

Micro-Electro-Mechanical Systems (MEMS) are integrated sensors, actuators, and electronics fabricated with processes similar to those used for integrated circuits. They integrate mechanical elements (such as sensors and actuators) with electronics on a common substrate through microfabrication technology. They convert physical parameters to or from electrical signals, and depend on mechanical structures or parameters in important ways for their operation.

MEMS devices use a sensor with sensing circuitry and/or an actuation device with drive circuitry to detect or produce physical phenomenon. MEMS sensors gather information by measuring any combination of mechanical, thermal, biological, chemical, optical, and magnetic phenomena. Electronics then process the information derived from the sensors, and through some decision making capability can direct the actuators to respond. Non-limiting responses include moving, positioning, regulating, pumping, and filtering, thereby controlling the environment for some desired outcome or purpose.

Early MEMS devices were used as accelerometers for automobile crash airbag deployment systems. Now, MEMS accelerometers are quickly replacing conventional accelerometers for crash airbag deployment systems in automobiles. The conventional approach uses several bulky accelerometers made of discrete components mounted in the front of the car with separate electronics near the airbag. MEMS made it possible to integrate the accelerometer and electronics onto a single silicon chip. MEMS accelerometers are therefore much smaller, more functional, lighter, more reliable, and are produced for a fraction of the cost of the conventional macroscale accelerometer elements.

MEMS can now be used in many other ways. Other non-limiting examples include pressure sensors, microvalves, and gyroscopes. They have applications in many areas, including health care, industrial automation (including automated semiconductor manufacturing), automotive systems (both vehicles and smart highways), global environmental monitoring, environmental controls, defense, and a wide variety of consumer products.

MEMS devices can also be used as switches in fiber optic networks. A MEMS optical switch includes at least one input port in optical communication with the proof-mass and at least one output port in optical communication with the proof-mass. The proof-mass directs light from at least one input port to at least one output port. When an electrostatic potential is applied to the at least one top and bottom electrodes, an electrostatic force is generated which causes the proof-mass to move and direct the light from at least one input port to at least one output port. The proof-mass then remains static until the light path needs to be redirected. In certain embodiments the proof-mass may form at least one mirror, at least one partially reflective mirror, and/or at least one diffraction grating. The proof-mass may be transparent to at least one wavelength of light. In other embodiments the device further contains at least one optical coating disposed on the proof-mass. The at least one optical coating may form at least one mirror, at least one partially reflective mirror, and/or at least one diffraction grating. The at least one optical coating can be conductive or non-conductive, and can be transparent to at least one wavelength of light. In certain embodiments the input and output ports may be fiber optic lines. These mirror-based switches can be two-dimensional, where they move up and down or left and right, or three-dimensional, where they can swivel in a broad range of movement. In other embodiments, the optical switch can be employed in an array, with up to thousands on a single chip. The result is an end-to-end photonic network which is more reliable and cost-effective, and has minimal performance drop-off. Additional applications include active sources, tunable filters, variable optical attenuators, and gain equalization and dispersion compensation devices.

MEMS devices are manufactured using batch fabrication techniques similar to those used for integrated circuits. Micro-mechanical components are fabricated using processes that selectively etch away parts of the silicon wafer or add new structural layers to form the mechanical and/or electromechanical devices. MEMS devices may contain a sensor device that makes use of a proof-mass suspended structure, and sensing circuitry that is commonly formed using typical semiconductor-type fabrication processes. Exemplary MEMS manufacturing techniques are described in the following references, which are hereby incorporated by reference in their entirety into this application: John J. Neumann, Jr. & Kaigham J. Gabriel, CMOS-MEMS Membrane for Audio-Frequency Acoustic Actuation, 95. Sensors & Actuators A 175-82 (2002); M. Mehregany et al., Integrated Fabrication of polysilicon Mechanisms, 35 IEEE Transactions on Electron Devices 719-23 (1988); Huikai Xie et al., Post-CMOS Processing for High-Aspect-Ratio Integrated Silicon Microstructures, 11 Journal of Microelectromechanical Systems 93-101 (2002); Kaigham J. Gabriel, Engineering Microscopic Machines, 273 Scientific American 118-21 (1995); Andrew A. Berlin & Kaigham J. Gabriel, Distributed MEMS: New Challenges for Computation, 4 IEEE Computational Science & Engineering 12-16 (1997).

Fabrication processes for existing MEMS devices are inefficient and costly due to the combination of individual steps required to fabricate a single device. Additionally, while electronic signal processing is increasingly being used in MEMS—in sensors, actuators, and integrated electronics, existing MEMS applications are limited in that they have relatively low levels of electromechanical integration and little interaction with mechanical components working alone or together to enable a complex action. For example, in a typical integrated circuit, the circuitry and the proof-mass suspended structure are formed on separate semiconductor layers. While the electronics are fabricated using integrated circuit (IC) process sequences (e.g., CMOS, Bipolar, or BIC-MOS processes), the micro-mechanical components are fabricated using compatible "micromachining" processes that selectively etch away parts of the silicon wafer or add new structural layers to form the mechanical and electromechanical devices. Therefore, the integration of on-chip circuits and proof-mass suspended structures usually require additional deposited layers or are built on a separate die.

Accordingly, a need exists for MEMS products with greater levels of electrical-mechanical integration. To satisfy this need for increasing levels of integration in MEMS devices, monolithic chips or multichip modules need to be developed. These monolithic devices would integrate sensing, driving, controlling, and signal processing electronics into fewer layers on a substrate. This integration promises to improve the performance of micro-mechanical devices, as well as reduce the cost of manufacturing, packaging, and instrumentation for these devices, by combining the micro-mechanical devices with an electronic sub-system in the same manufacturing and packaging process.

SUMMARY OF THE INVENTION

The present invention is directed to a MEMS device and a method of fabricating a MEMS device that substantially obviates at least one of the problems due to limitations and disadvantages of the related art.

In one embodiment, the invention provides a single monolithic die and method of manufacturing thereof wherein the die is capable of sensing or producing movement of a suspended proof-mass in at least one of the x-, y-, and z-directions, where the silicon, metal, and oxide layers comprising the circuit region also comprise the MEMS structures, thereby eliminating the need for additional depositions.

Another embodiment of the invention provides a monolithic device and method of manufacturing thereof wherein both a MEMS device and at least one chip containing drive/sense circuitry are unitarily formed in at least one circuit region on a semiconductor die of at least one semiconductor layer on a substrate without requiring additional deposited layers or a separate die.

Another embodiment of the invention provides a monolithic MEMS device and method of manufacturing thereof wherein the proof-mass, support structure, and electrodes are fabricated in the same semiconductor layers as the drive/sense circuitry.

Yet another embodiment of the invention provides a MEMS device and method of manufacturing thereof wherein the MEMS device may be used for multi-axis inertial sensors, tilt sensors, optical switches, and other MEMS applications.

To achieve these and other advantages and in accordance with the purpose of the invention, as embodied and broadly described, a MEMS device includes a proof-mass, balanced or unbalanced, suspended by at least one spring or elastic device and free to move in at least one of the x-, y-, and z-directions, with at least one electrode embedded in the at least one spring or elastic device. The at least one spring or elastic device is attached to a support structure, which is attached to the substrate. The proof-mass, support structure, and at least one electrode are fabricated in the same semiconductor layers as the drive/sense circuitry. In certain embodiments, the at least one spring or elastic device and the support structure form a network of supports. The proof-mass, suspended by the network of supports, is free to move in any direction. The MEMS capacitively senses or produces movement of the proof-mass in any direction. In certain embodiments, the direction can include a direction along at least one of the x-, y-, and z-directions.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory only, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to the preferred embodiments of the present invention, examples of which are illustrated in the accompanying drawings.

Figure 1A:
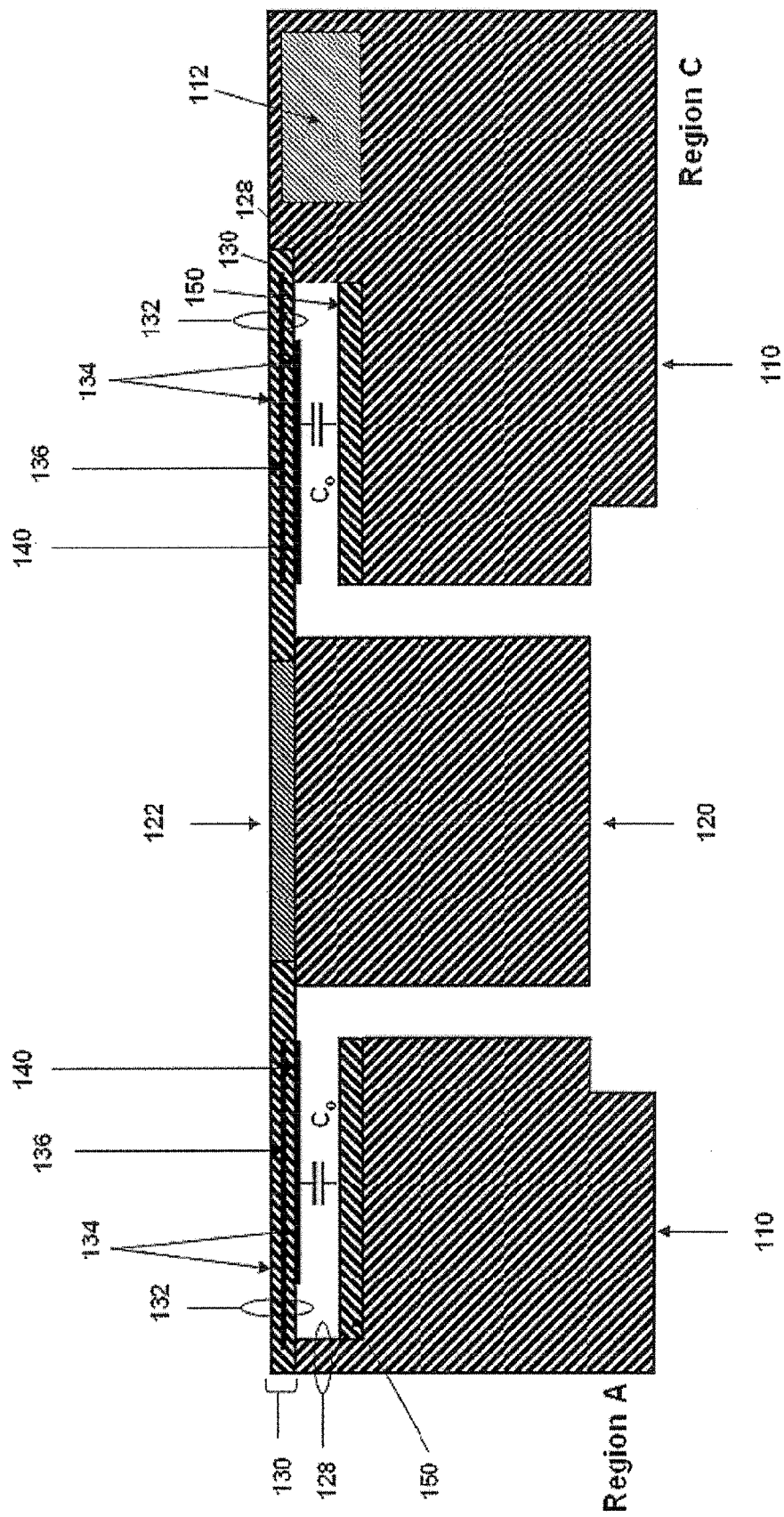
FIG. 1A is a cross-sectional view of an embodiment of a proof-mass supported by springs containing a mechanical layer which further contains a conductive layer and an insulating layer.

FIG. 1A is a cross-sectional view of an embodiment of a proof-mass 120 supported by springs 130 containing a mechanical layer 132 which further contains a conductive layer 136 and an insulating layer 134. At least one bottom conductive electrode 150 beneath the at least one spring 130 can be used to actuate the proof-mass 120 or sense movement of the proof-mass 120 in response to an external force or motion. The drive/sense circuitry 112 is located on the substrate 110 and fabricated at the same time as the at least one spring 130. The proof-mass system 100 can be any shape and can be sub-divided into any number of regions. In the embodiment shown, the proof-mass system 100 has four unique sets of top and bottom conductive electrodes 140, 150 defining four regions (A, B, C, and D). Regions A and C are shown in FIG. 1A.

The proof-mass 120 is formed by separating from a substrate 110 a region made entirely or in part of silicon, polysilicon, semiconductor dielectric material(s), or metal. In certain embodiments, the proof-mass 120 has a thickness no greater than the substrate 110. The proof-mass 120 may be released from the substrate 110 using standard MEMS etch techniques. Two etching techniques are wet etching and dry plasma etching. MEMS etch techniques may include the removal of material from the substrate 110 until the desired structure of the proof-mass 120 is achieved. Once released, no further process etching is applied to the proof-mass 120. The proof-mass 120 can be formed in any shape. The proof-mass 120 may be shaped either before or during the release process. In certain embodiments, the shape of the proof-mass 120 is defined by the release process. The top surface 122 and/or other surfaces of the proof-mass 120 may have a combination of metal and oxide layers, and may have additional coatings depending upon the specific application.

In certain embodiments, the proof-mass 120 is suspended by at least one elastic device. The at least one elastic device contains at least one conductive layer 136. Some or all of the material surrounding the at least one conductive layer 136 is removed. The remaining material surrounding the at least one conductive layer 136 forms at least one insulating layer 134. Once the material beneath the at least one elastic device is removed, the at least one elastic device is free to move in at least one of the x-, y-, and z-directions. At least one anchor 128 establishes a mechanical connection between the at least one elastic device and the proof-mass 120. The mechanical connection between the at least one anchor 128 and the at least one elastic device is established by forming the at least one anchor 128 in the at least one conductive layer 136 of the at least one elastic device using standard MEMS etching techniques.

In certain embodiments, springs 130 can be used as elastic devices. In certain other embodiments, springs 130 form a network of spring supports. The springs 130 may contain but are not limited to serpentine loops, mesh patterns, crab-leg flexures, folded flexures, or simple beams. Regions of springs 130 may be designed to respond to a force or movement in a specific direction. The springs 130 may contain a mechanical layer 132 and at least one conductive layer 136. The mechanical layer 132 includes any or all of the following: an insulating layer 134, such as silicon oxide and/or silicon nitride, or other semiconductor dielectric material(s), to prevent shorting between the top and bottom conductive electrodes 140, 150; and a conductive layer 136 made of metal or polysilicon that may be electrically isolated from the at least one top conductive electrode 140. The mechanical layer 132 connects the proof-mass 120 to the die (not shown) while suspending the at least one top conductive electrode 140 above the at least one bottom conductive electrode 150.

In the embodiment shown in FIG. 1A the at least one top conductive electrode 140 is located beneath the at least one conductive layer 136. The top conductive electrode 140 may be encased in an insulating material (not shown). In other embodiments, the at least one conductive layer 136 may function as the at least one top conductive electrode 140. In still other embodiments, the at least one top conductive electrode 140 is not present at all. The top and bottom conductive electrodes 140, 150 can be made of metal and/or polysilicon, or may be formed as a doped region within the substrate 110. An air gap separates the springs 130 and the at least one bottom electrode 150. The air gap may be created by etching silicon, polysilicon, and/or semiconductor dielectric material(s) beneath the springs 130. The at least one bottom conductive electrode 150 is located beneath the springs 130. An initial capacitance $C_0$ is generated between the at least one top and bottom conductive electrodes 140, 150. The initial capacitance $C_0$ between the at least one top and bottom conductive electrodes 140, 150 can increase or decrease depending on the direction of applied force.

This capacitance is sensed differentially with on-chip electronics (not shown). The on-chip electronics and the MEMS drive/sense circuitry are fabricated in the same layers to reduce parasitic capacitance. Parasitic capacitance reduces the effectiveness of capacitive sensor/actuator conversion of mechanical energy to electrical energy and vice versa. By fabricating the on-chip electronics and MEMS drive/sense circuitry in the same layers, the electromechanical interface is more tightly coupled than if the mechanical structure were fabricated on a separate die, or with layers not used in the drive/sense circuitry. This tighter coupling reduces the parasitic capacitance between the MEMS drive/sense circuitry and the on-chip electronics input/output to levels below what is achievable using separate dies or additional layers to form the mechanical structure.

Figure 1B:
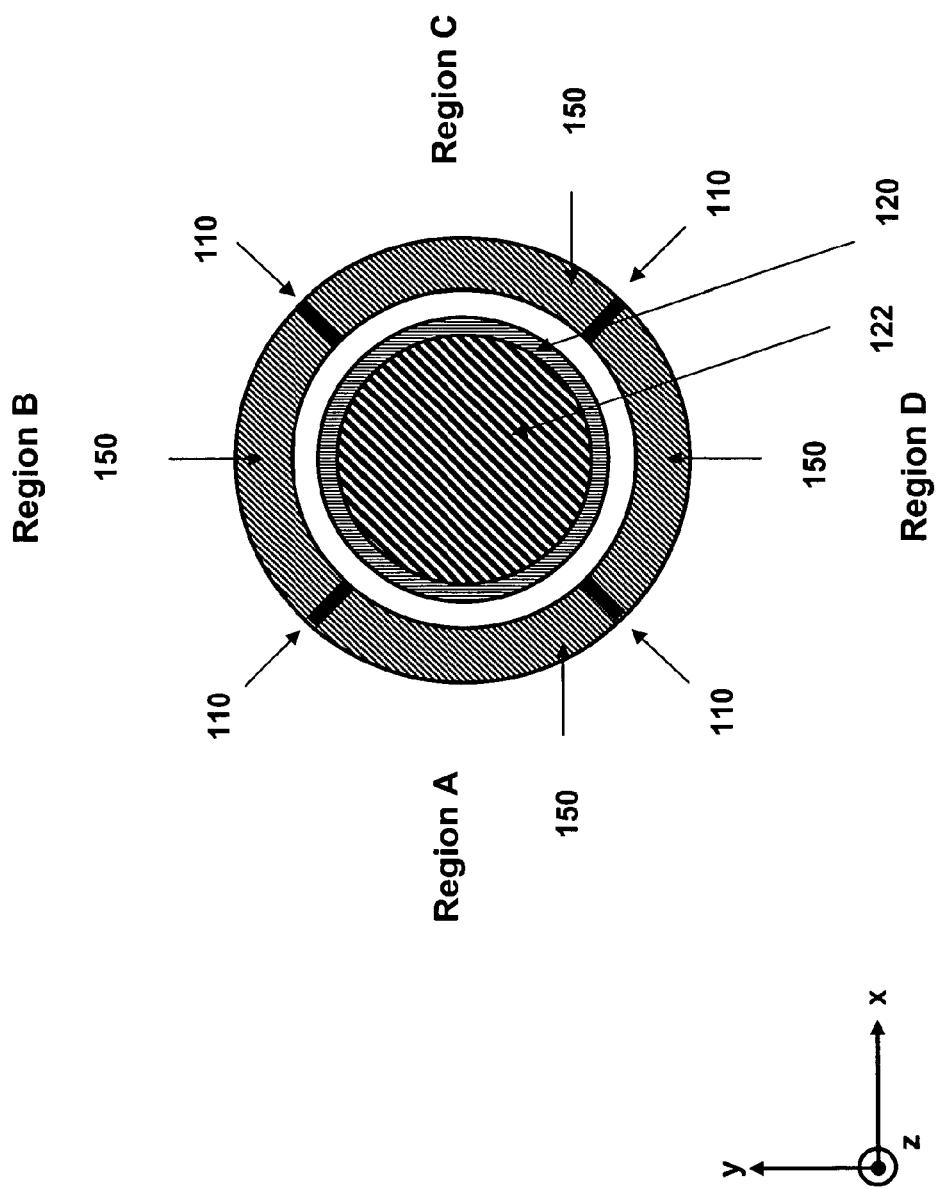
FIG. 1B is a plan view of the embodiment shown in FIG. 1A with the anchor springs, and the at least one top electrode omitted for clarity.

FIG. 1B is a plan view of the embodiment shown in FIG. 1A with the anchor 128, springs 130, and the at least one top electrode 140 omitted for clarity. It shows the proof-mass 120, the proof-mass top surface 122, regions A, B, C, and D of the at least one bottom electrode 150 separated by portions of the substrate 110. Even though the proof-mass system 100 shown has four unique sets of top and bottom conductive electrodes 140, 150 defining four regions (A, B, C, and D), the proof-mass system 100 can be any shape and can be sub-divided into any number of regions.

Figure 2A:
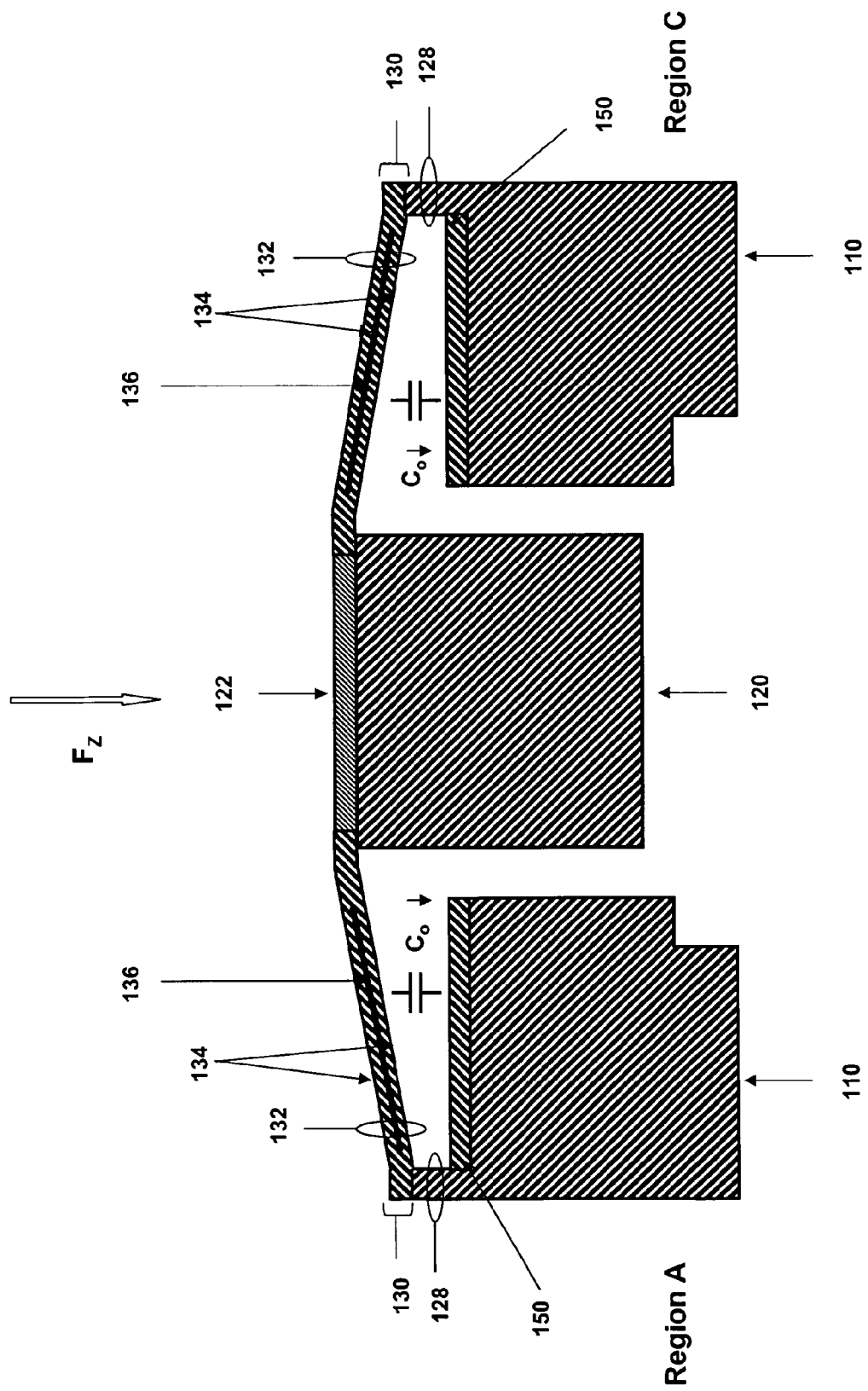
FIG. 2A is a cross-sectional view of an embodiment of a spring-supported proof-mass moving in response to an external force $F_z$ or acceleration in the negative z-direction.

FIG. 2A is a cross-sectional view of an embodiment of a spring-supported proof-mass 120 moving in response to an external force $F_z$ or acceleration in the negative z-direction. In the embodiment shown, the at least one conductive layer 136 functions as the at least one top conductive electrode 140. The initial capacitances $C_0$ between the at least one top and bottom conductive electrodes 140, 150 can increase or decrease depending on the direction of applied force. The suspended proof-mass 120 and springs 130 move away from the substrate 110. As the distance between the at least one top and bottom electrodes 140, 150 increases, the capacitance between the at least one top and bottom conductive electrodes 140, 150 decreases in all four regions. These changes can be sensed by electronics (not shown) located on the substrate 110. The common mode sum of these capacitance changes represents the z-component of the force $F_z$. No differential signal is produced in the x- and y-directions, as the differential term that represents the x- and y-components cancel out to zero. The arrangement of the at least one top and bottom electrodes 140, 150 is exemplary only, and not limited to the arrangement shown. In another embodiment, a force $F_z$ in the negative z-direction can be sensed by an increase in the capacitance in all four regions using an arrangement where the distance between the at least one top and bottom electrodes 140, 150 decreases in response to a force in the negative z-direction.

Figure 2B:
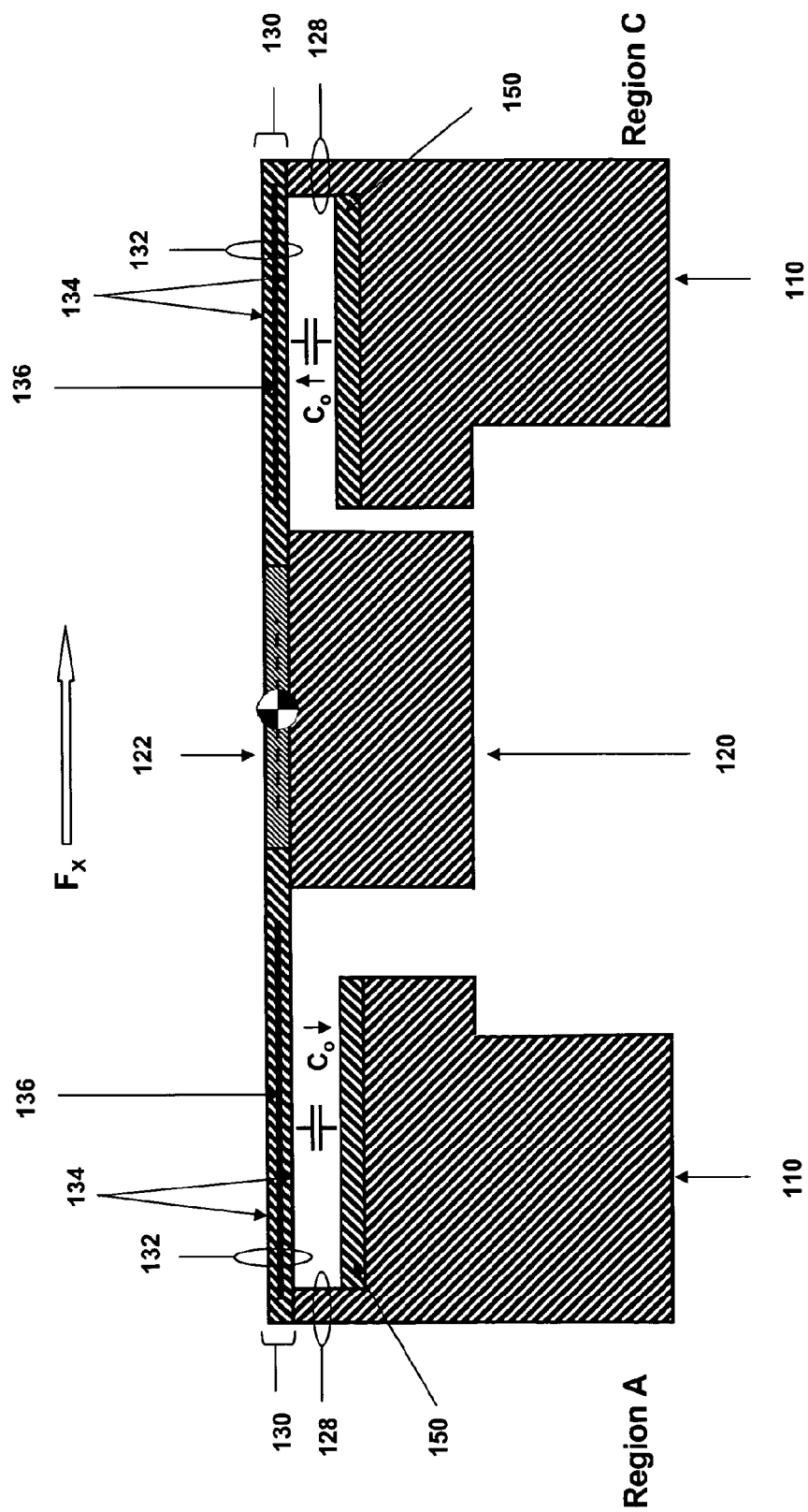
FIG. 2B is a cross-sectional view of an embodiment of a spring-supported proof-mass moving in response to an external force or acceleration in the positive x-direction, with the proof-mass center of mass located in a plane defined by the springs.

FIG. 2B is a cross-sectional view of an embodiment of a spring-supported proof-mass 120 moving in response to an external force $F_x$ or acceleration in the positive x-direction, with the proof-mass 120 center of mass located in a plane defined by the springs 130. In the embodiment shown, the at least one conductive layer 136 functions as the at least one top conductive electrode 140. With the proof-mass 120 center of mass located in a plane defined by the springs 130, a force $F_x$ or acceleration in the positive x-direction produces a lateral movement of the proof-mass 120 in the positive x-direction. The initial capacitance $C_0$ generated between the at least one top and bottom conductive electrodes 140, 150 increases or decreases depending on the direction of the applied force. In FIG. 2B the capacitance decreases in region A as the area between the at least one top and bottom electrodes 140, 150 in region A decreases, and the capacitance in increases region C as the area between the at least one top and bottom electrodes 140, 150 in region C increases. These changes can be sensed differentially by electronics (not shown) located on the substrate 110. As there is no y-component or z-component to the force $F_x$ shown in FIG. 2B, any changes to the capacitances in regions B and D (shown in FIG. 1B) differentially cancel out to zero. The arrangement of the at least one top and bottom electrodes 140, 150 is exemplary only, and not limited to the arrangement shown. In another embodiment, movement in the positive x-direction can be sensed by an increase in the capacitance in region A and a decrease in the capacitance in region C, using an arrangement where a movement in the positive x-direction causes the area between the at least one top and bottom electrodes 140, 150 in region A to increase and the area between the at least one top and bottom electrodes 140, 150 in region C to decrease.

Figure 2C:
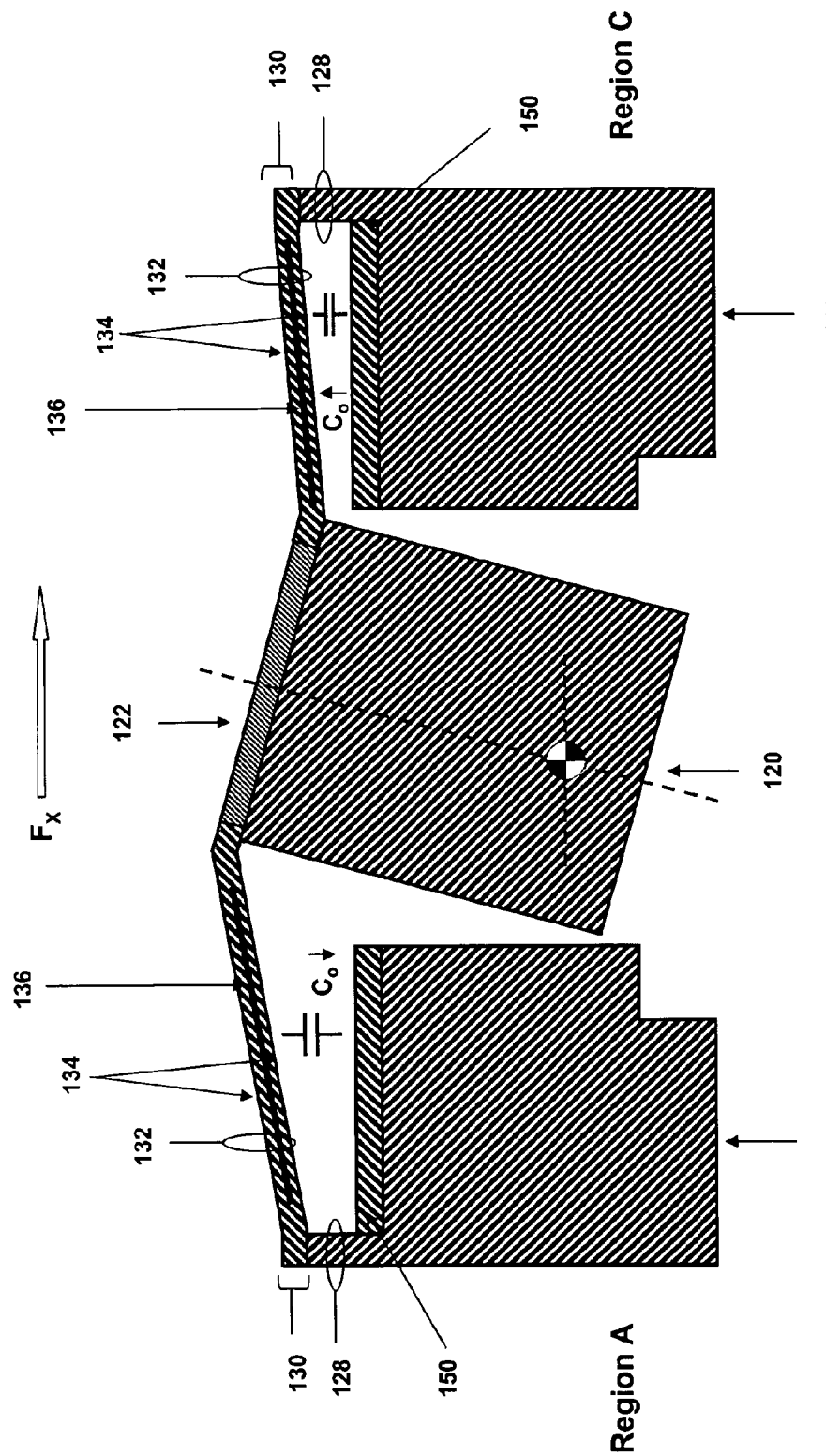
FIG. 2C is a cross-sectional view of an embodiment of a spring-supported proof-mass moving in response to an external force or acceleration in the positive x-direction, with the proof-mass center of mass located outside a plane defined by the springs.

FIG. 2C is a cross-sectional view of an embodiment of a spring-supported proof-mass 120 moving in response to an external force $F_x$ or acceleration in the positive x-direction, with the proof-mass 120 center of mass located outside a plane defined by the springs 130. In the embodiment shown, the at least one conductive layer 136 functions as the at least one top conductive electrode 140. With the proof-mass 120 center of mass located outside a plane defined by the springs 130, a force $F_x$ or acceleration in the positive x-direction produces a rotation of the proof-mass 120, as well as a lateral movement of the proof-mass 120 in the positive x-direction. The initial capacitance $C_0$ generated between the at least one top and bottom conductive electrodes 140, 150 decreases in region A and increases in region C. These changes can be sensed differentially by electronics (not shown) located on the substrate 110. The arrangement of the at least one top and bottom electrodes 140, 150 is exemplary only, and not limited to the arrangement shown. In another embodiment, movement in the positive x-direction can be sensed by an increase in the capacitance in region A and a decrease in the capacitance in region C. As there is no y- or z-component to the force shown in FIG. 2C, any changes to the capacitances in regions B and D (shown in FIG. 1B) differentially cancel out to zero.

Figure 3:
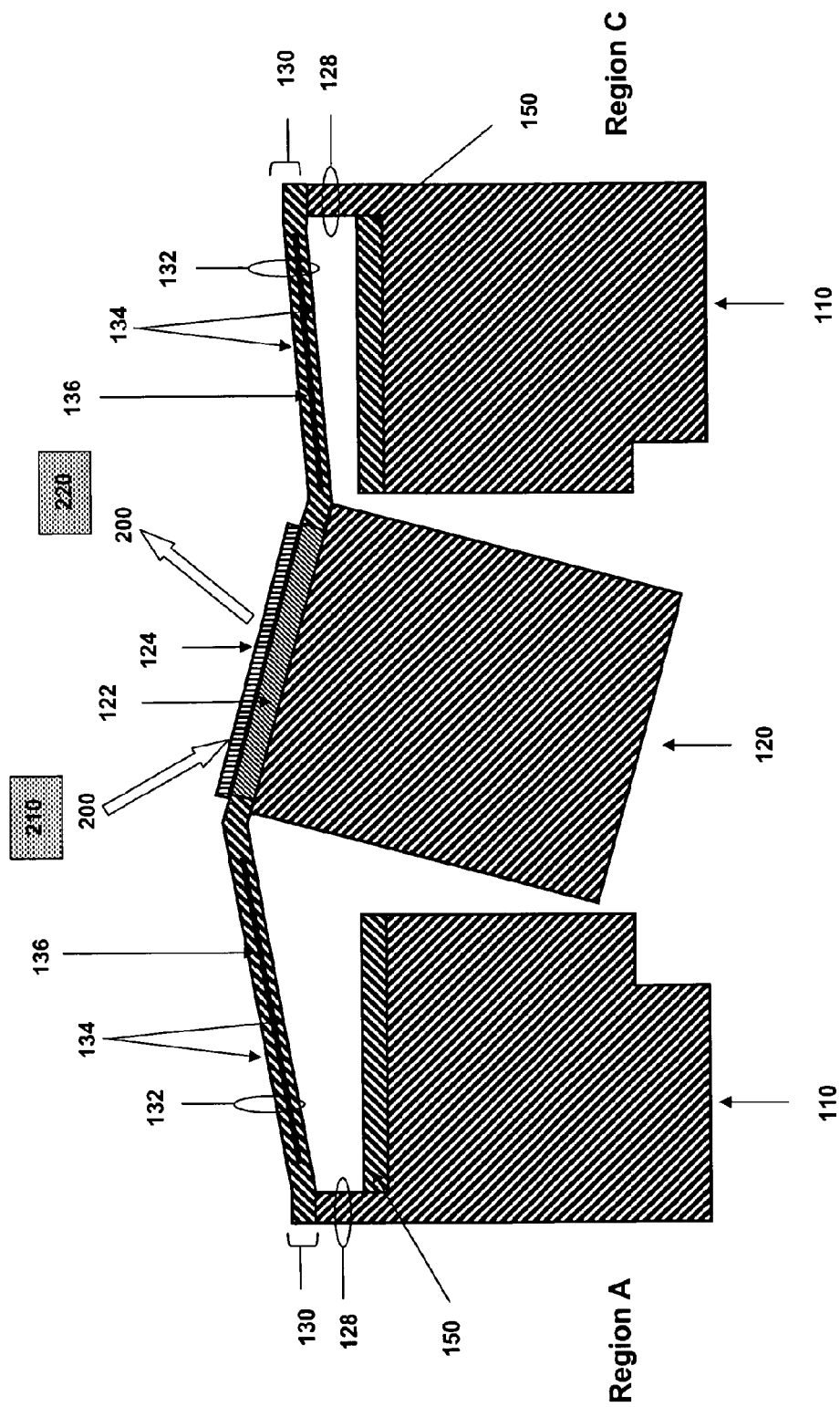
FIG. 3 is a cross-sectional view of an embodiment of a spring-supported proof-mass moving in response to an electrostatic force generated between the at least one top and bottom conductive electrodes in region C.

FIG. 3 is a cross-sectional view of an embodiment of a spring-supported proof-mass 120 moving in response to an electrostatic force generated between the at least one top and bottom conductive electrodes 140, 150 in region C. In the embodiment shown, the at least one conductive layer 136 functions as the at least one top conductive electrode 140. The electrostatic force can be used to move the suspended proof-mass 120. The electrostatic force is generated by creating an electrostatic potential between the at least one top and bottom electrodes 140, 150. In the embodiment shown the at least one conductive layer 136 also functions as the at least one top conductive electrode 140. The at least one top conductive electrode 140 is encased in an insulating mechanical layer 132 to avoid shorting when the at least one top electrode 140 is attracted toward the at least one bottom electrode 150. In the embodiment shown the electrostatic potential created between the at least one top and bottom electrodes 140, 150 in region C generates an electrostatic force in the negative z-direction, rotating the suspended proof-mass 120 and moving it laterally in the positive x-direction. The movement in FIG. 3 is exemplary only, and not limited to what is shown. An electrostatic potential can be created between the at least one top and bottom electrodes 140, 150 in other combinations to generate an electrostatic force that can rotate and/or move the proof-mass 120 in any direction. In certain embodiments, the rotation and/or movement can include a direction along at least one of the x-, y-, and z-axes.

The embodiment shown in FIG. 3 may function as an optical switch to direct light 200 from one fiber to another. At least one optical coating 124 disposed on the proof-mass 120 directs light 200 for optical applications. The at least one optical coating 124 can be conductive or non-conductive. The at least one optical coating 124 can form a reflective mirror, a partially reflective mirror, or contain slits to form a diffraction grating. The at least one optical coating 124 can be optically transparent to specific light wavelengths. Though shown with the at least one optical coating 124 disposed on the proof-mass 120 top surface 122, the at least one optical coating 124 can be disposed on only a portion of the top surface 122, on another surface of the proof-mass, or on a portion of another surface of the proof-mass 120. In other embodiments the proof-mass 120 may be used in combination with an optical coating 124 to direct light 200. In still other embodiments, the proof-mass 120 itself directs light 200, and an optical coating 124 is not required.

The optical switch further includes at least one input port 210 in optical communication with the proof-mass 120, and at least one output port 220 in optical communication with the proof-mass 120. When the proof-mass 120 moves, it directs light 200 to at least one output port 220. The proof-mass 120 then remains static until the light 200 need to be redirected. The proof-mass 120 then moves again to redirect the light 200. The number and location of the at least one input port 210 and the at least one output port 220 are exemplary only, and can vary in other embodiments as long as they remain in optical communication with the proof-mass 120 and/or at least one optical coating 124. In some embodiments, the at least one input and at least one output ports 210, 220 may be fiber optic lines in optical communication with the proof-mass 120 and/or at least one optical coating 124. These optical switches can be two-dimensional, where they move up and down or left and right, or three-dimensional, where they can swivel in a broad range of movement. In other embodiments, the optical switch can be employed in an array, with up to thousands on a single chip. The result is an end-to-end photonic network that is more reliable and cost-effective, and has minimal performance drop-off.

Figure 4A:
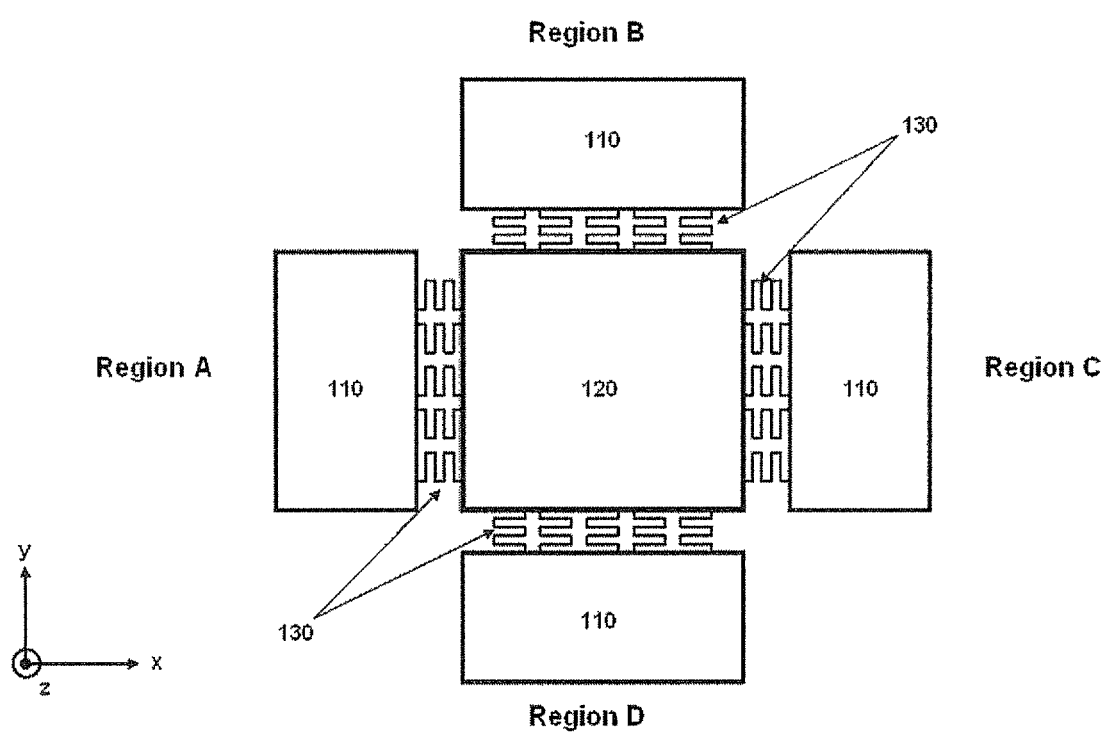
FIG. 4A is a top view of an embodiment of a proof-mass suspended by multiple sets of serpentine loop springs anchored to a die and substrate.
Figure 4B:
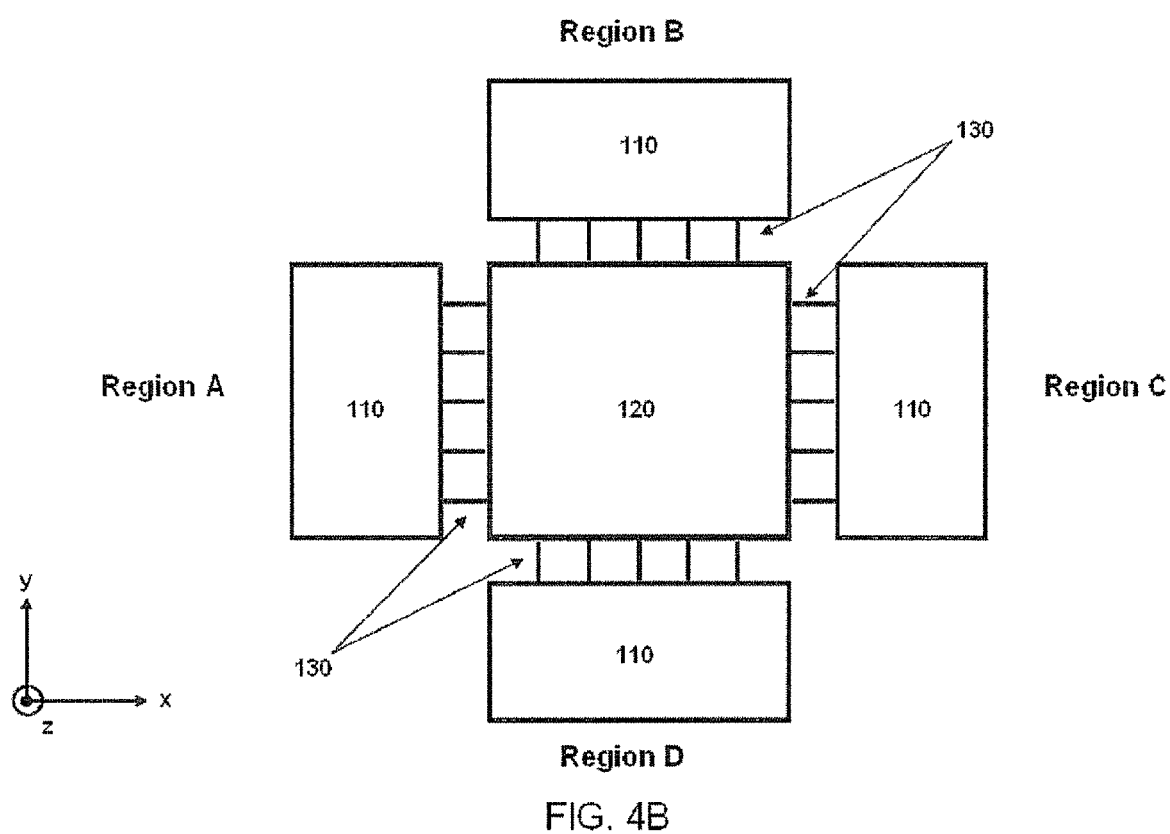
FIG. 4B is a top view of an embodiment of a proof-mass suspended by multiple sets of simple beam springs anchored to a die and substrate.
Figure 4C:
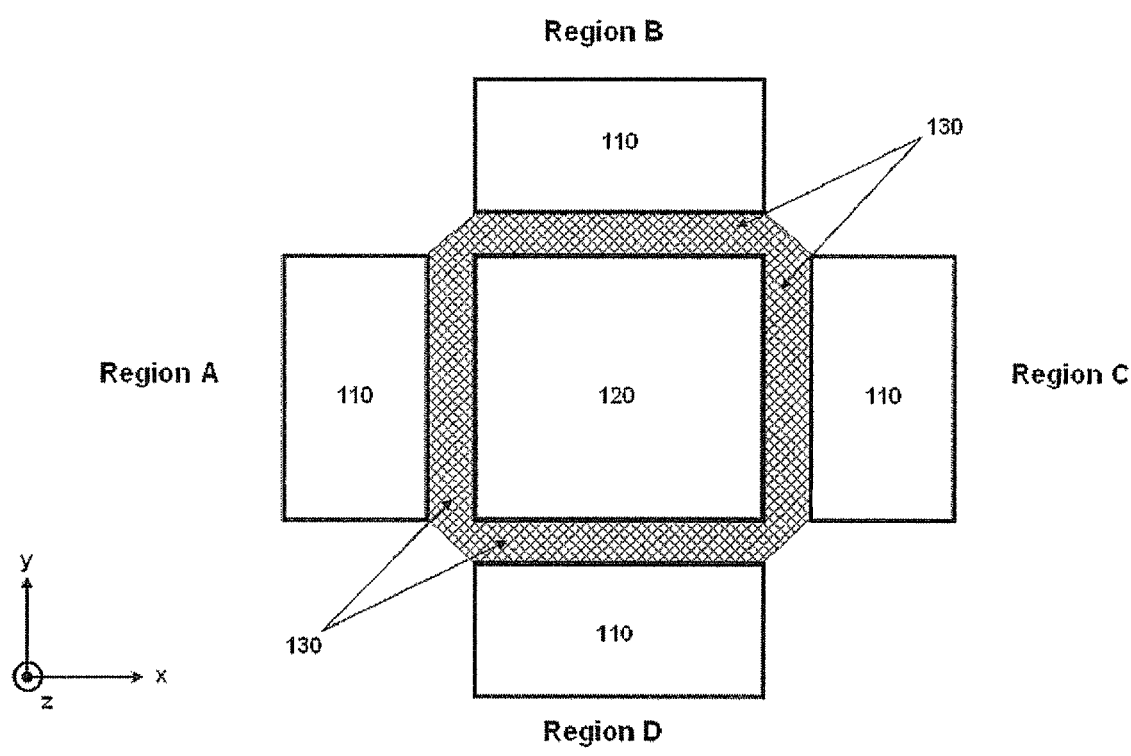
FIG. 4C is a top view of an embodiment of a proof-mass suspended by multiple sets of mesh pattern springs anchored to a die and substrate.
Figure 4D:
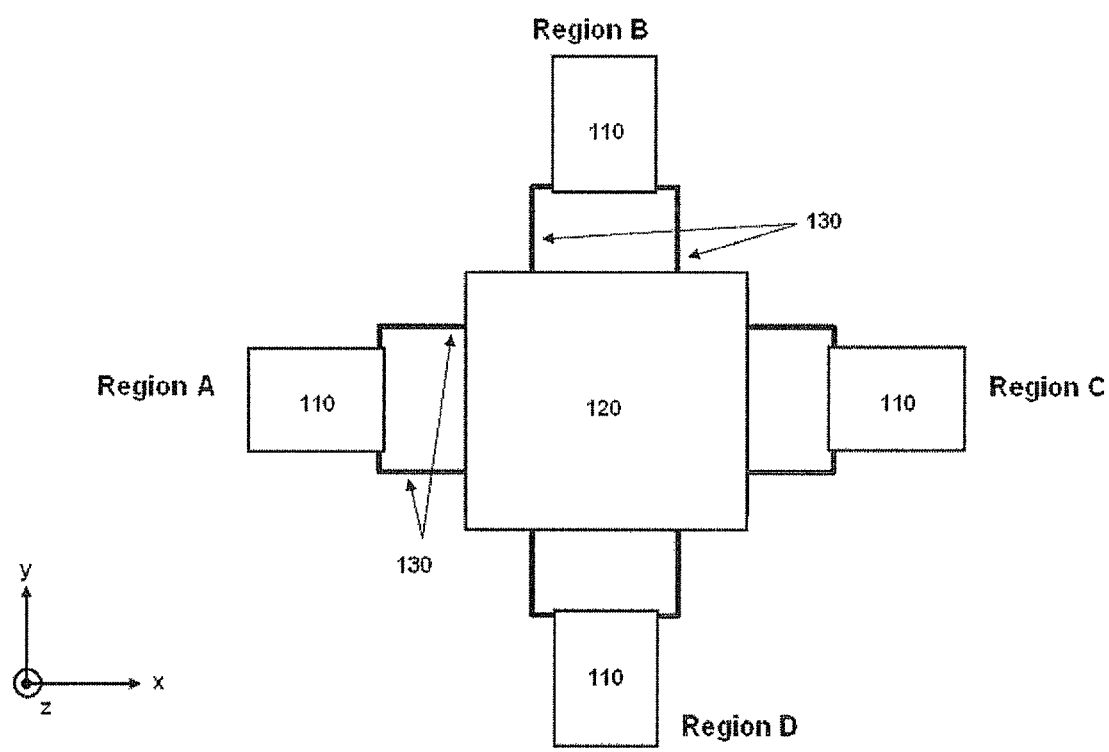
FIG. 4D is a top view of an embodiment of a proof-mass suspended by multiple sets of crab-leg flexure springs anchored to a die and substrate.
Figure 4E:
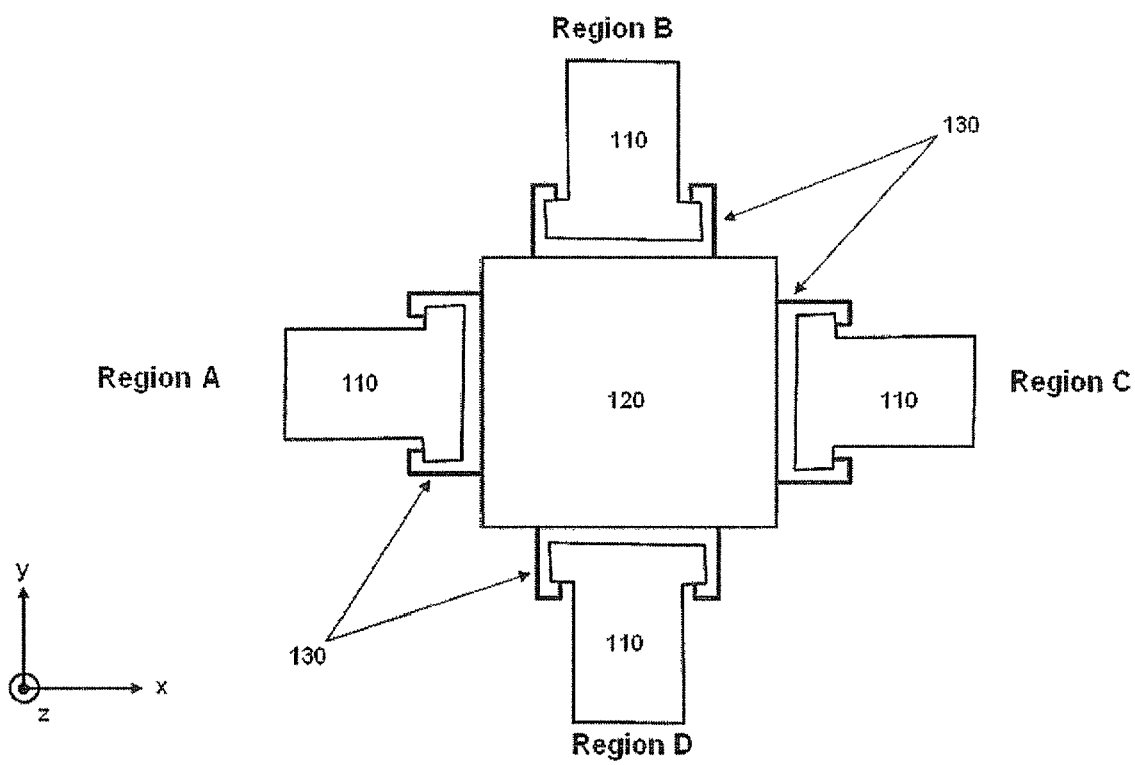
FIG. 4E is a top view of an embodiment of a proof-mass suspended by multiple sets of folded flexure springs anchored to a die and substrate.

FIG. 4A is a top view of an embodiment of a proof-mass 120 suspended by multiple sets of serpentine loop springs 130 that are anchored to a die (not shown) and substrate 110. In this embodiment, the springs 130 in regions A and C of the proof-mass 120 are designed to respond to forces along the x- and z-directions, while the springs 130 in regions B and D respond to forces in the y- and z-directions. The distribution of the springs 130 in this figure is exemplary only, and not limited to the distribution shown. The springs 130 can be distributed and grouped in other ways depending on the specific application. In certain embodiments, the proof-mass 120 includes at least one spring 130 on each side. In other embodiments, two or more springs can be used on each side. In other embodiments, the number of springs used on a particular side can be the same or different than the number of springs used on an opposite or adjacent side.

Figure 5A:
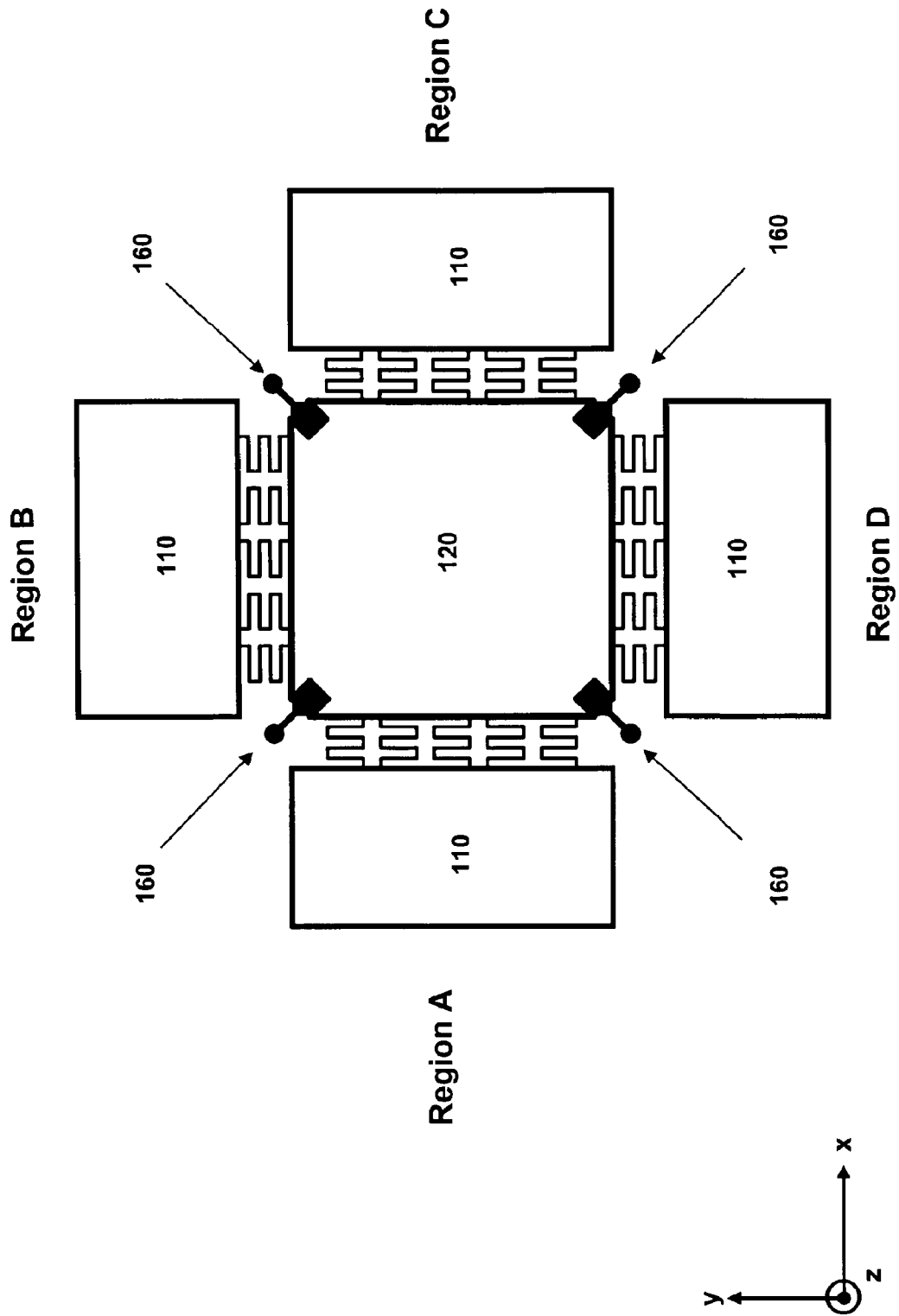
FIG. 5A is a top view of an embodiment of a proof-mass suspended by multiple sets of springs and surrounded by four over-travel stops.
Figure 5B:
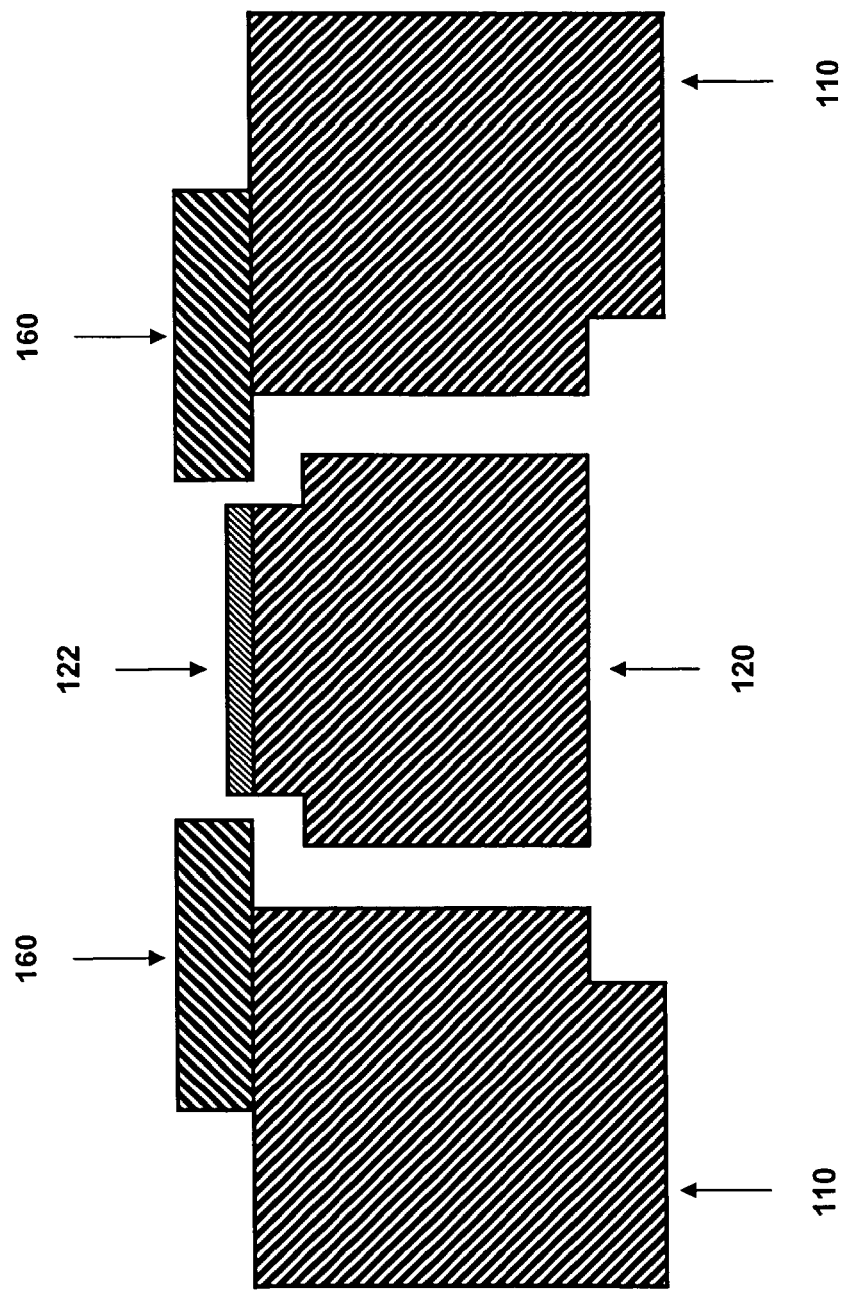
FIG. 5B is a cross-sectional view of an embodiment of a proof-mass suspended by springs and surrounded by over-travel stops anchored to a substrate.

FIGS. 5A and 5B show an embodiment of the invention with at least one over-travel stop 160. The at least one over-travel stop 160 prevents the proof-mass 120 from moving beyond operational limits. The at least one over-travel stop 160 can be made of metal, polysilicon, and/or any semiconductor dielectric material(s), and may contain holes. The at least one over-travel stop 160 is manufactured concurrently with the at least one elastic device, in the same manner as the at least one elastic device. A section of the at least one over-travel stop 160 is anchored to the substrate 110 and is not released. The other sections of the at least one over-travel stop 160 are released in the same manner as the at least one elastic device. In certain embodiments, the at least one over-travel stop 160 may contain at least one conductive layer. The at least one conductive layer protects the at least one over-travel stop 160 during the release of the proof-mass 120. The material surrounding the at least one conductive layer in the sections of the at least one over-travel stop 160 to be removed is removed, while the at least one conductive layer and any insulation material beneath the at least one conductive layer remain.

FIG. 5A is a top view of an embodiment of a proof-mass 120 suspended by multiple sets of serpentine loop springs 130 and surrounded by four over-travel stops 160. The location and the quantity of over-travel stops 160 are exemplary only, and not limited to the quantity or the locations shown. As an example, at least one over-travel stop 160 may be inserted at least one corner edge of the proof-mass 120 as shown in FIG. 5A. The over-travel stops 160 are located at the corner edges of the proof-mass 120 to prevent the proof-mass 120 from moving too far in either the x- and y-directions. The over-travel stops 160 are anchored into the substrate 110 so they do not move when the proof-mass 120 pushes against them. The released portion of the at least one over-travel stop 160 is located above a portion of the proof-mass 120 and prevents the proof-mass 120 from moving too far in the positive z-direction. The substrate 110 prevents the springs 130 from moving too far in the negative z-direction.

FIG. 5B is is a cross-sectional view of an embodiment of a proof-mass 120 suspended by springs 130 and surrounded by over-travel stops 160 anchored to a substrate 110. The over-travel stops 160 float over a portion of the proof-mass 120 and prevent it from moving too far from the surface as the over-travel stops 160 partially overlap the proof-mass 120. The location and the quantity of over-travel stops 160 are exemplary only, and not limited to the quantity or the locations shown.

What is claimed is:

1. A micro-electromechanical-system (MEMS) device, comprising:
   a substrate;
   at least one semiconductor layer provided on the substrate;
   a circuit region including at least one chip containing drive/sense circuitry, the circuit region provided on the at least one semiconductor layer;
   a support structure attached to the substrate;
   at least one elastic device attached to the support structure;
   a proof-mass suspended by the at least one elastic device and free to move in all of the x-, y-, and z-directions;
   at least one top electrode provided on the at least one elastic device; and
   at least one bottom electrode located beneath the at least one elastic device such that an initial capacitance is generated between the at least one top and bottom electrodes;
   wherein:
   the MEMS device is configured to produce an electrostatic potential between the at least one top electrode and the at least one bottom electrode that applies a force to the suspended proof-mass in at least one of the x-, y-, and z-directions; and
   the drive/sense circuitry, proof-mass, support structure, and the at least one top and bottom electrodes are fabricated on the at least one semiconductor layer.

2. The device according to claim 1, wherein the force applied to the proof-mass causes the proof-mass to move in at least one of the x-, y-, and z-directions.

3. The device according to claim 1, wherein the force applied to the proof-mass causes the proof-mass to tilt along at least one of the x-, y-, and z-directions.

4. The device according to claim 1, wherein the drive/sense circuitry generates the electrostatic potential between the at least one top electrode and the at least one bottom electrode.

5. The device according to claim 1, further comprising:
   at least one input port in optical communication with the proof-mass; and
   at least one output port in optical communication with the proof-mass;
   wherein the proof-mass directs light waves from at least one input port to at least one output port.

6. The device according to claim 5, wherein the device is an optical switch.

7. The device according to claim 6, wherein the drive/sense circuitry generates the electrostatic potential between the at least one top and bottom electrodes.

8. The device according to claim 6, wherein the device is one of a plurality employed in an array.

9. The device according to claim 6, wherein the proof-mass forms at least one reflective mirror.

10. The device according to claim 6, wherein the proof-mass forms at least one partially reflective mirror.

11. The device according to claim 6, wherein the proof-mass forms at least one diffraction grating.

12. The device according to claim 6, wherein the proof-mass is transparent to at least one wavelength of light.

13. The device according to claim 6, further comprising at least one optical coating disposed on the proof-mass.

14. The device according to claim 13, wherein the at least one optical coating forms at least one reflective mirror.

15. The device according to claim 13, wherein the at least one optical coating forms at least one partially reflective mirror.

16. The device according to claim 13, wherein the at least one optical coating forms at least one diffraction grating.

17. The device according to claim 13, wherein the at least one optical coating is transparent to at least one wavelength of light.

18. A micro-electromechanical-system (MEMS) device, comprising:
   a substrate;
   at least one semiconductor layer provided on the substrate;
   a circuit region including at least one chip containing drive/sense circuitry, the circuit region provided on the at least one semiconductor layer;

a support structure attached to the substrate;
at least one elastic device attached to the support structure;
a proof-mass suspended by the at least one elastic device and free to move in all of the x-, y-, and z-directions;
at least one conductive layer provided on the at least one elastic device; and
at least one bottom electrode located beneath the at least one elastic device such that an initial capacitance is generated between the at least one top and bottom electrodes;

wherein:
the MEMS device is configured to produce an electrostatic potential between the at least one conductive layer and the at least one bottom electrode that applies a force to the suspended proof-mass in at least one of the x-, y-, and z-directions; and
the drive/sense circuitry, proof-mass, support structure, and the at least one top and bottom electrodes are fabricated on the at least one semiconductor layer.

19. The device according to claim 18, wherein the force applied to the proof-mass causes the proof-mass to move in at least one of the x-, y-, and z-directions.

20. The device according to claim 18, wherein the force applied to the proof-mass causes the proof-mass to tilt along at least one of the x-, y-, and z-directions.

21. The device according to claim 18, wherein the drive/sense circuitry generates the electrostatic potential between the at least one conductive layer and the at least one bottom electrode.

* * * * *